United States Patent [19]

Wallace

[11] Patent Number: 5,426,533
[45] Date of Patent: Jun. 20, 1995

[54] APPARATUS FOR ENHANCING COLLIMATION AND IMPROVING COLLECTION EFFICIENCY FROM HIGH ASPECT RATIO LINEAR ENERGY SOURCES

[75] Inventor: Robert E. Wallace, Garland, Tex.

[73] Assignee: Varo Inc., Garland, Tex.

[21] Appl. No.: 914,447

[22] Filed: Jul. 15, 1992

[51] Int. Cl.$^6$ .................. G02B 3/06; G02B 13/18
[52] U.S. Cl. ..................... 359/710; 359/738; 359/808; 385/34; 355/67
[58] Field of Search .......... 359/708, 710, 707, 738, 359/798, 808; 372/101, 103; 362/259, 311, 372; 355/67; 356/3, 8, 9; 385/33, 34

[56] References Cited

U.S. PATENT DOCUMENTS

| | | | |
|---|---|---|---|
| 4,186,431 | 1/1980 | Engel et al. | 362/223 |
| 4,630,180 | 12/1986 | Muraki et al. | 362/223 |
| 4,847,734 | 7/1989 | Katoh et al. | 362/32 |
| 4,932,732 | 6/1990 | Nakajima | 359/210 |
| 5,081,639 | 1/1992 | Snyder et al. | 372/101 |
| 5,127,068 | 6/1992 | Baer et al. | 385/34 |

FOREIGN PATENT DOCUMENTS 1284801 11/1989 Japan ............... G02B 3/08

Primary Examiner—Loha Ben
Assistant Examiner—Darryl J. Collins
Attorney, Agent, or Firm—Baker & Botts

[57] ABSTRACT

There is provided an apparatus for improving power transfer or collection efficiency from a high aspect ratio linear junction laser diode to associated collimation optics in a weapon rangefinder, illuminator, laser spot projector, optical security system, or other optical device. A cylindrical or rod lens (16) is positioned adjacent to the emitting region (14) of the laser diode (10), the longitudinal axis of the rod lens (16) being parallel to the emitting region (14). Preferably, the emitting region (14) of the laser diode (10) is located at the bottom of a V-shaped surface (20) of the laser diode (10), for facilitating alignment of the rod lens (16) with the emitting region (14). The rod lens (16) may comprise a fiber optic strand of either glass or plastic material, and is small enough to be totally encapsulated within the window capped case (26) of the laser diode (10) o The cylindrical lens can be a gradient index type, holographic optical element, aspheric, or a combination of the aforementioned as well as circular cross-section rod lens. In an alternative embodiment, a rod lens (16) may be used to collect and collimate light emitted from a wire filament in a copier or page scanner, for example.

19 Claims, 4 Drawing Sheets

APPARATUS FOR ENHANCING COLLIMATION AND IMPROVING COLLECTION EFFICIENCY FROM HIGH ASPECT RATIO LINEAR ENERGY SOURCES

TECHNICAL FIELD OF THE INVENTION

The present invention relates to optical systems and, more particularly, is concerned with an apparatus for improving power transfer or collection efficiency from a high aspect ratio linear junction laser diode or other linear energy source to associated optics.

BACKGROUND OF THE INVENTION

Linear junction laser diodes are used in many applications in which the emitted rays must be collimated and projected by appropriate optics to illuminate a distant spot or object. Such applications include weapon rangefinders, illuminators, optical security systems, laser spot projectors, page scanners, and copiers.

A laser diode is a commercially available type of semiconductor laser. A typical off-the shelf pulsed laser diode is the Stantel LE Series type LE25-02. This diode is of GaAs/GaAlAs single heterostructure semiconductor laser design. This and similarly constructed laser diodes emit uncollimated rays over a wide angle of divergence from a high aspect ratio linear junction or emitting region. The LE25-02 diode has a divergence of 28 degrees perpendicular to the emitting junction and 20 degrees parallel to the emitting junction. A collimating lens of practical size for most applications with long junctions can therefore collect only a relatively small percentage of the emitted power.

Prior collimation optics for diodes simply use combinations of lenses (spherical and aspheric including cylindrical) which are placed far in front of the diode. Typical spacing of prior art lenses from the diode range from about 30 to 1000 times junction length.

Collimating lens f/numbers are usually high (about 4 to 6) for high aspect ratio junctions. For low aspect ratio junctions (aspect ratio less than about 10), lower f/number optics can be used because the lens focal length can be much shorter. Long junctions require long focal lengths for low divergence and good collimation. Since lens diameter greatly affects optics weight, lens diameter is limited by weight. The f/number tends to increase as lens focal length increases. But high f/number optics do not collect diode power efficiently. For example, manufacturer,s data for the LE25-02 diode indicates that an f/4 lens will capture 36% of radiant power emitted by this diode at 25 degrees C. The remaining 63% misses the lens and is lost.

A further difficulty with collimating rays from long junctions is that simple optics project a collimated beam which has much greater divergence in one direction than the other (corresponding to the aspect ratio of the junction). This divergence difference must be accepted or cylindrical optics must be employed with two focal lengths—one focal length for collimating the junction width, another for collimating the junction length. Cylindrical collimation lenses have been found to be difficult to align and they are costly compared to spherical lenses.

Consequently, for long junction laser diodes, a need exists for a collimating means to improve power transfer from diode to collimation lenses (collection efficiency) which results in a projected beam from collimation lenses with reasonably equal divergences without the need for cylindrical collimation lenses. Preferably, such a collimating means will be optically simple, light weight, inexpensive, and will require little space within the device in which it is used.

SUMMARY OF THE INVENTION

The present invention provides a coupling means for a high aspect ratio linear junction laser diode or other linear energy source which satisfies the aforementioned needs. A very small cylindrical or rod lens (diameter on the order of the junction length) is positioned in close proximity to the linear energy source, the longitudinal axis of the rod lens being parallel to the source. In the case of a high aspect ratio linear junction laser diode, the diode emitting region is preferably located at the bottom of a V-shaped surface in the laser diode chip. The rod lens is disposed against the V-shaped surface for facilitating alignment of the rod lens with the emitting region. The rod lens preferably comprises a circular cross-section strand of either glass or plastic material, and is small enough to be totally encapsulated within the window capped case of the laser diode. Its function is essentially that of a micro-field lens which couples power from the diode emitted in a plane perpendicular to the junction to the collimating lens while broadening the apparent width of the junction at the same time.

In another aspect of the invention, a method for improving the degree of collimation of light emitted from a linear junction laser diode having an elongated emitting region and a window capped case is provided. A cylindrical lens is positioned in a spaced relationship with the emitting region of the laser diode such that the longitudinal axis of the cylindrical lens is parallel to the emitting region. In this manner, the angle of light emitted from the emitting region is substantially reduced by the cylindrical lens.

In yet another aspect of the invention, an improved laser diode which emits light having enhanced collimation is constructed by manufacturing a linear junction laser diode having a semiconductor chip with a V-shaped surface formed therein and an emitting region disposed at the bottom of the V-shaped surface, and then positioning a cylindrical lens spaced a fraction of the cylindrical lens diameter from the emitting region. The longitudinal axis of the cylindrical lens is thus parallel to the emitting region and the cylindrical lens is disposed within the V-shaped surface of the semiconductor chip to facilitating alignment of the cylindrical lens with the emitting region.

DETAILED DESCRIPTION OF THE INVENTION

Figure 1:
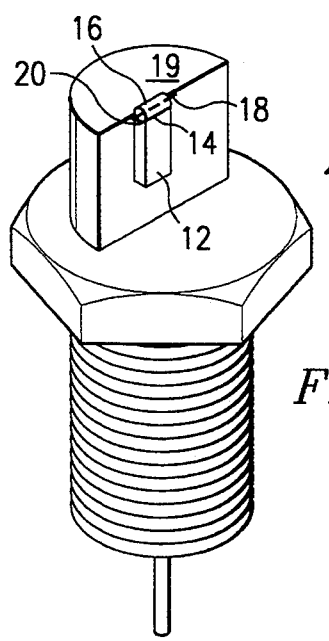
FIG. 1 is a perspective view of a linear junction, semiconductor laser diode with the window cap removed, and a rod lens of the present invention at the emitting region.

The preferred embodiment of the present invention and its advantages are best understood by referring to the drawings, like numerals being used for like and corresponding parts of the various drawings.

Figure 2:
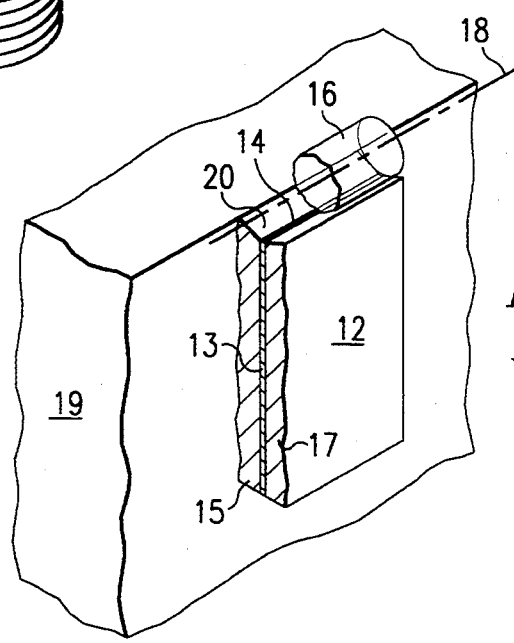
FIG. 2 is an enlarged perspective view of the rod lens and adjacent portion of the laser diode of FIG. 1, a portion of the semiconductor chip of the laser diode being fragmented to show its internal structure.

Referring now to the drawings, and more particularly to FIG. 1, there is shown a single emitting region laser diode, indicated generally as 10, which incorporates the present invention. For clarity, diode 10 is shown with the window capped case removed. As best seen in FIG. 2, semiconductor chip 12 of diode 10 has a dielectric waveguide layer 13 sandwiched between dissimilar n-type and p-type semiconductor materials 15 and 17, respectively. Semiconductor materials 15 and 17 may be gallium arsenide (GaAs) and gallium aluminum arsenide (GaAlAs), for example. The free upper surface of dielectric layer 13 forms an elongated linear junction or emitting region 14 for laser diode 10. Semiconductor chip 12 is attached to heat sink 19, which is typically of metallic material.

As also seen in FIG. 2, cylindrical or rod lens 16 is positioned closely adjacent to emitting region 14, and with the longitudinal axis 18 of rod lens 16 parallel to emitting region 14. For proper performance, rod lens 16 must be aligned parallel to emitting region 14 with a relatively high degree of precision. Experiment has shown that, for the exiting beam from rod lens 16 to be directed perpendicular to the plane of emitting region 14, rod lens 16 must be aligned to within plus or minus 2% of the rod lens 16 diameter. To facilitate correct alignment, emitting region 14 is preferably located at the bottom of a v-shaped surface or v-cut 20 in laser diode chip 12. Placement of rod lens 16 in v-cut 20 facilitates proper alignment with emitting region 14.

Rod lens 16 may be positioned either directly against, or a fraction of rod diameter away from, emitting region 14. Rod lens 16 is preferably slightly longer than emitting region 14, and may be secured to chip 12 with any suitable optical adhesive (not shown).

Figure 3:
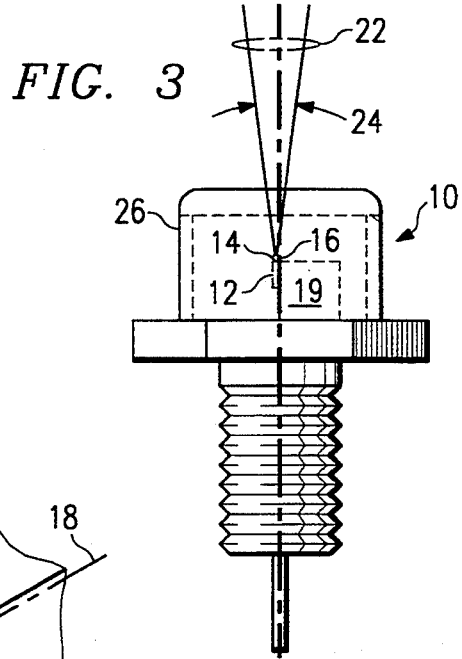
FIG. 3 is a side elevational view, partially in cross section, of the laser diode and rod lens of FIG. 1, showing an angle of divergence of emitted rays obtainable with the present invention.

Referring now to FIG. 3, it is seen that the use of rod lens 16 in accordance with the present invention produces marked reduction in divergence of the rays 22 exiting the laser diode 10. The angle of divergence 24 of rays 22 can be minimized by varying the index of refraction of the rod, and/or the distance between rod lens 16 and emitting region 14.

FIG. 3 also illustrates another significant feature of the present invention: the size, and hence weight, of rod lens 16 is miniscule in comparison with diode weight. For example, a rod lens 16 having a diameter of 0.005 inch and length of 0.006 inch can greatly reduce the divergence of rays from an RCA C86039EW2 laser diode. A glass rod lens of this size weighs only 5 micrograms and is representative of the weight of other rod lenses for long junction diodes. This weight is barely detectable, and certainly not significant. The small size of rod lens 16 permits it to be totally encapsulated within window capped case 26 of laser diode 10 without any interference or dimensional changes to case 26.

A further advantage of the present invention is that rod lens 16 can be made from a fiber optic strand without any need for grinding or polishing. Thus, both the material cost and the labor cost of manufacturing rod lens 16 are negligible in comparison with a prior art lens. Rod lens 16 may comprise either optical glass or optical plastic. The preferred rod lens for use with an RCA C86039EW2 laser diode has a refractive index of 1.75. A fiber optic may also be used successfully because the presence of the cladding does not greatly affect performance in this use. Alternatively, rod lens 16 may be a gradient index type, holographic optical element, aspheric, or a combination of these types.

Figure 4:
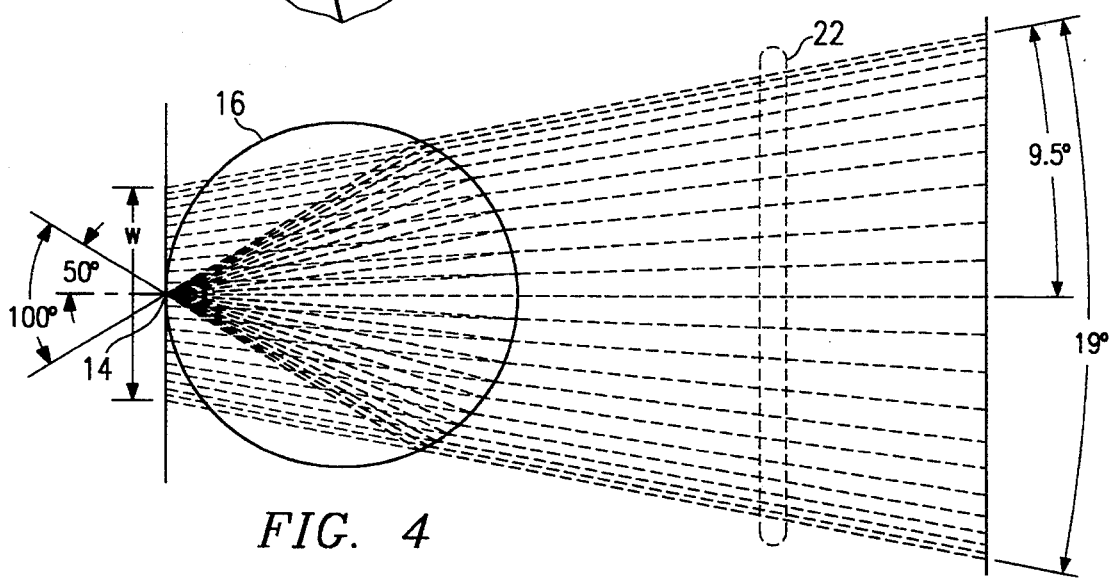
FIG. 4 is an enlarged, cross sectional view of the rod lens of FIG. 1, showing the path of emitted rays through and from the rod lens.

Referring now to FIG. 4, there is shown an enlarged, cross-sectional view of rod lens 16 and the lines traced by rays emitted from a laser diode emitting region 14 (represented by point 14). As seen, in a plane perpendicular to emitting region 14, rod lens 16 captures radiant flux or power within a 100 degree angle (50 degree half-angle) and reduces divergence to an exiting angle of only 19 degrees (9.5 degree half-angle).

Experiment has shown that, by collecting radiant flux over a 50 degree half-angle, rod lens 16 captures approximately 95% of emitted power, and misses only 5%. Yet, the 9.5 degree half-angle rays exiting the rod lens 16 can be intercepted and collimated by a collimation lens (not shown) as small as f/3. Without rod lens 16, a much larger f/0.65 collimating lens (not shown) would be required to intercept rays diverging at a 50 degree half-angle and to capture 95% of the emitted power. An f/0.65 collimating lens would be much too large, and prohibitively expensive, for many laser diode applications. Alternatively, without the use of rod lens 16, the same f/3 collimating lens would capture only approximately 24% of the emitted power, missing 76%.

The use of a smaller collimation lens made possible by this invention translates into significant cost savings in a laser spot projection system, among other applications. Cost is reduced first because a smaller projection lens can be used if the same power is to be projected. Secondly, higher f-number lenses often mean less complexity for the same image sharpness and quality. Thus, if fewer optical elements are needed for the smaller projection lens, an even greater cost savings can be realized.

A significant weight reduction is also possible with this invention. Weight is inversely proportional to f-number cubed for similar optics. The use of an f/3 lens instead of an f/0.65 lens of similar construction reduces weight by a factor of approximately 100. If the f/0.65 lens is more complex than the f/3 lens, as is likely, then still greater weight savings will result.

In lieu of reducing collimating and projection lens size and weight, another alternative made possible by the present invention is to keep the larger optics, but to reduce the drive current through the laser diode 10. Drive current can be reduced because the use of rod lens 16 significantly increases the emitted power collected by the larger optics. Reduced drive current in turn increases diode life.

Referring again to FIG. 4, the exiting ray lines 22 traced backwards through rod lens 16 produce an apparent width w of emitting region 14 that is substantially wider than its actual width. For example, a 0.005 inch diameter rod lens will cause an emitting region of 1.5 micron actual width to appear 0.003 inches wide. Since the unmodified emitting region aspect ratio is typically quite extreme, this apparent broadening of the emitting region width makes the elongated emitting region appear much squarer as seen through the rod lens. This is desirable in many applications because the projected beam from the laser diode will have more nearly equal horizontal and vertical divergence angles. The rod lens 16 of the present invention produces a projected spot aspect ratio which can be adjusted by appropriately selecting the rod diameter.

Figure 5:
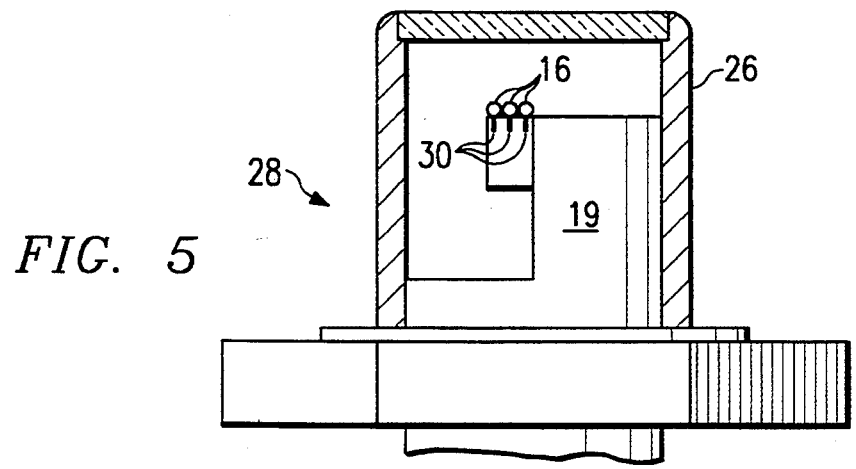
FIG. 5 is an enlarged, side elevational view, partially in cross-section, of the upper portion of a laser diode with three parallel emitting regions and three respective rod lenses of the present invention.

Referring now to FIG. 5, there is shown an enlarged, side elevational view, partly in cross-section, of the upper portion of a triple emitting region, or 3-chip, laser diode 28. A commercially available 3-chip diode is the Stantel LE Series Type LE25-02, having a 905 nm output. This diode has three parallel, side-by-side emitting regions 30 spaced 0.0045 inches apart. Each emitting region 30 is approximately 1.5 microns wide and 230 microns long. In accordance with the present invention, a rod lens 16 is positioned closely adjacent to each emitting region 30, in the same manner as described above with respect to the single emitting region laser diode 10. As seen in FIG. 5, the tiny rod lenses 16 are totally encapsulated within window capped case 26 without any interference or dimensional changes to case 26. For the Stantel Type LE 25-02 diode, experiment has shown that the rod lenses 16 improve the power transfer efficiency between the diode and receiving optics by a factor of 2.1 for an f/6.0 lens. Although described with respect to the Stantel Type LE 25-02 diode, the present invention will work equally well with any single-junction or multi-junction laser diode.

Figure 7:
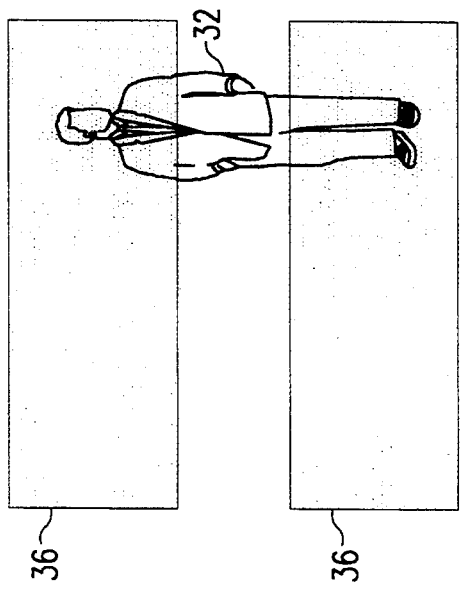
FIG. 7 is a schematic representation of a range finder subject and the projected image from a rangefinder having a three parallel emitting region laser diode collimated by the apparatus of the present invention.
Figure 6:
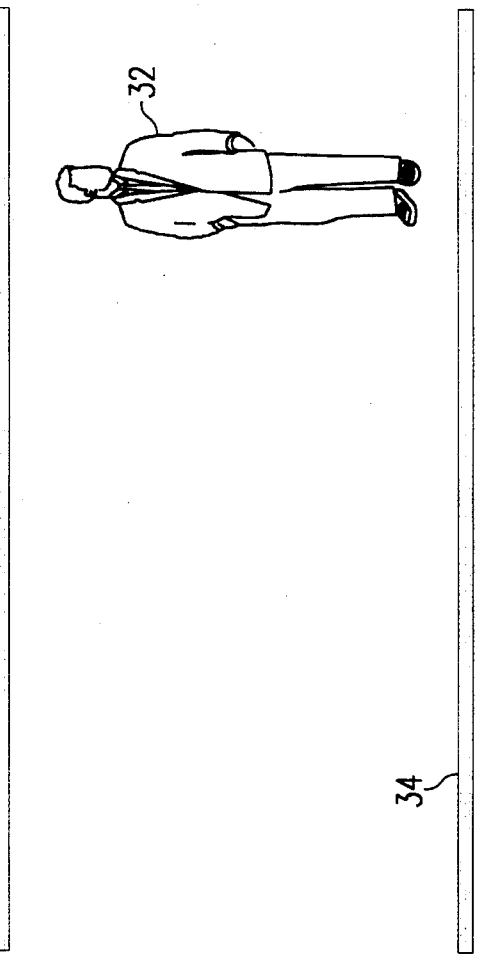
FIG. 6 is a schematic representation of a rangefinder subject and the projected image from a rangefinder of the prior art having a laser diode with three parallel emitting regions.

Referring now to FIGS. 6 and 7, there are shown projected images from a 3-chip laser diode as it might be used in a weapon rangefinder to illuminate a distance subject 32. FIG. 6 shows the projected images 34 from an unmodified, commercially available 3-chip diode of the prior art. FIG. 7 shows the projected images 36 from the same diode, but incorporating the rod lenses 16 of the present invention. As seen in FIG. 7, the rod lenses 16 greatly improve the projected spot aspect ratio of the projected images and permit a subject 32 that might be missed by a rangefinder of the prior art to be spotted by a rangefinder incorporating the present invention.

Although the present invention has been described in detail with reference to its application to single and multi-chip laser diodes, the rod lens of the present invention can be used to reduce the divergence of emissions or radiations from any linear energy source. For example, a glass rod lens 16 could be used in an illuminator, page scanner or copier to roughly collimate light emitted by a wire filament light source. Other possible applications for the present invention include rangefinders, laser spot projectors, and optical security systems.

Figure 8:
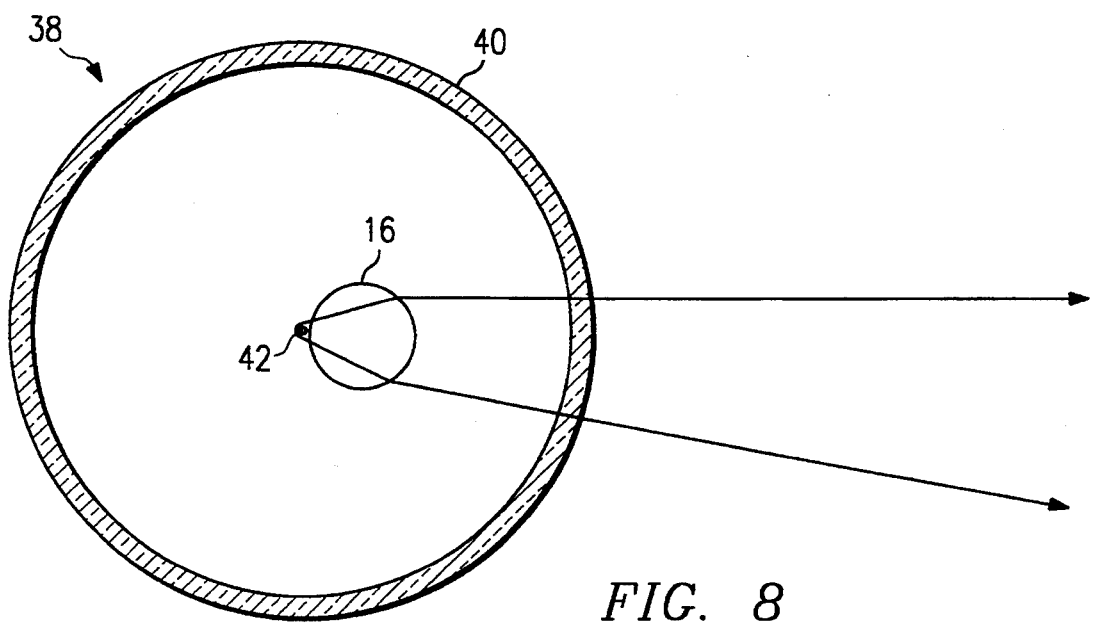
FIG. 8 is a cross-sectional view of an illuminator of the present invention.

FIG. 8 illustrates an illuminator 38 embodying the present invention. Illuminator 38 includes a sealed glass tube 40. Tube 40 is evacuated and contains an electrically conductive wire filament 42 extending substantially its entire length and along its longitudinal axis. A rod lens 16 of the present invention is positioned near the wire filament 42 so that light rays entering rod lens 16 are collimated as they exit illuminator 38. Rod lens 16 in this application preferably comprises fused silica for thermal resistance to the heat generated by wire filament 42.

Figure 9:
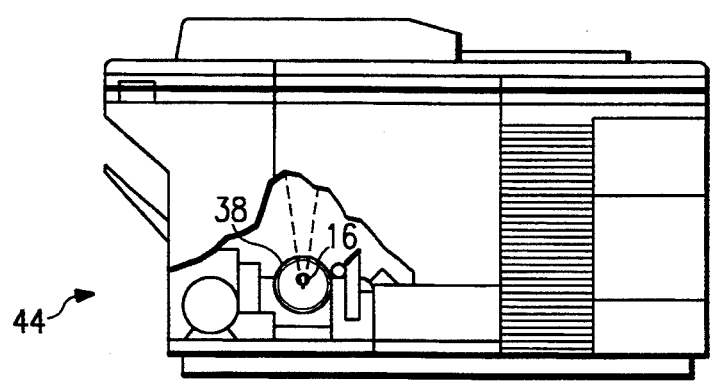
FIG. 9 is a partially fragmented, front view of a copier having a wire filament light source and rod lens of the present invention.
Figure 10:
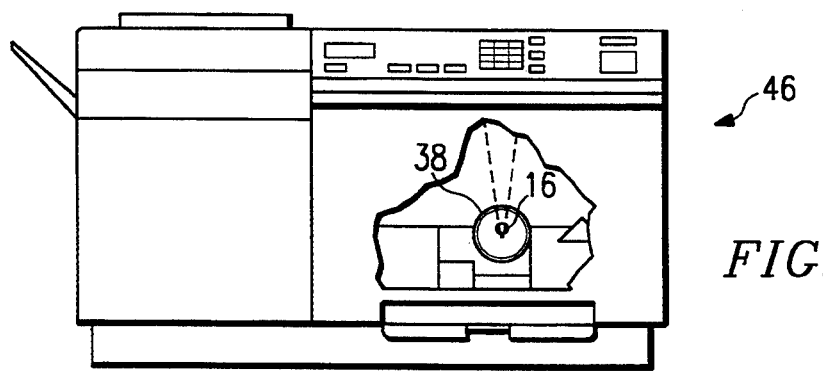
FIG. 10 is a partially fragmented, front view of a page scanner having a wire filament light source and rod lens of the present invention.

FIG. 9 illustrates a copier 44 having an illuminator 38 with a rod lens 16 of the present invention. FIG. 10 illustrates a page scanner 46 having an illuminator 38 with a rod lens 16 of the present invention.

Figure 11:
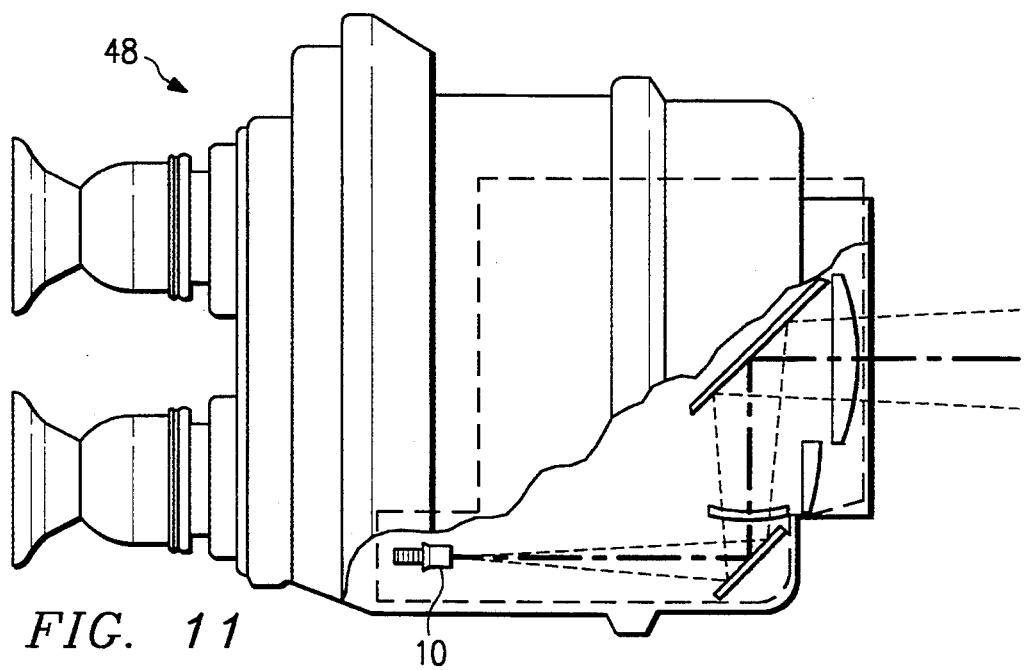
FIG. 11 is a partially fragmented, top view of a rangefinder having a laser diode and rod lens of the present invention.
Figure 12:
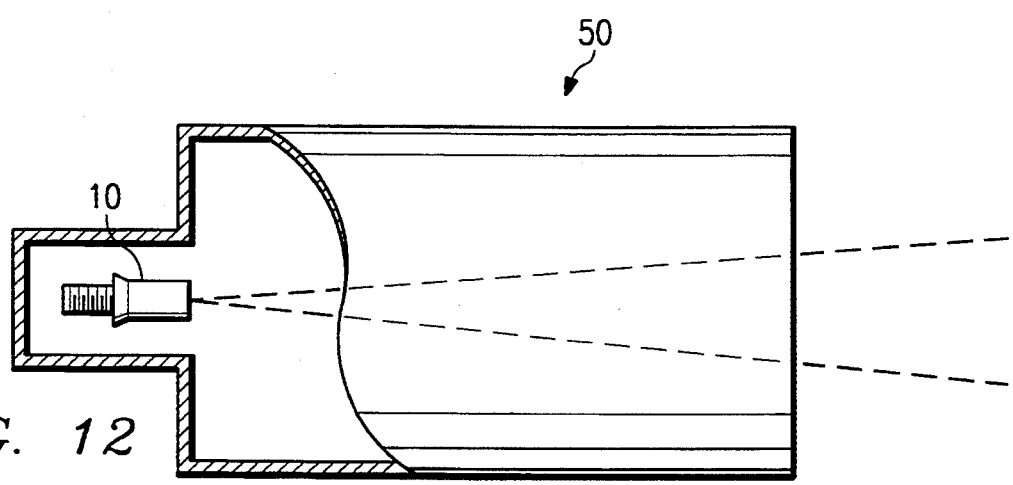
FIG. 12 is a partially fragmented, side view of a laser spot projector having a laser diode and rod lens of the present invention.

FIG. 11 illustrates a rangefinder 48 having a laser diode 10 and rod lens (not illustrated) of the present invention. FIG. 12 illustrates a laser spot projector 50 having a laser diode 10 and rod lens (not illustrated) of the present invention. Laser spot projector 50 might be used as part of an optical security system for protecting a home or business, for example.

The improved optical system of the present invention and many of its intended advantages will be understood from the foregoing description and it will be apparent that, although the invention and its advantages have been described in detail, various changes, substitutions, and alterations may be made in the manner, procedure, and details thereof without departing from the spirit and scope of the invention, as defined by the appended claims, or sacrificing all of its material advantages, the form hereinbefore described being merely a preferred or exemplary embodiment thereof.

What is claimed is:

1. An improved optical system in which radiation emitted from a high aspect ratio linear junction laser diode having an elongated emitting junction is projected to a collimating lens to irradiate an object, the improvement comprising:

a cylindrical lens having a circular cross-section with a diameter on the order of the high aspect ratio linear laser diode emitting junction length and being spaced a fraction of the diameter of the cross-section from the emitting junction of the high aspect ratio linear laser diode, the longitudinal axis of the cylindrical lens being parallel to the longitudinal axis of the high aspect ratio linear laser diode, whereby widely divergent radiation emitted from the high aspect ratio linear laser diode in a plane perpendicular to the longitudinal axis of the high aspect ratio linear laser diode passes through the cylindrical lens and is converted to a narrowly diverging radiation and projected to the collimating lens.

2. The improved optical system of claim 1, wherein the cylindrical lens comprises a fiber optic strand.

3. The improved optical system of claim 2, wherein the cylindrical lens comprises optical glass.

4. The improved optical system of claim 2, wherein the cylindrical lens comprises optical plastic.

5. The improved optical system of claim 1 incorporated in a copier.

6. The improved optical system of claim 1 incorporated in a page scanner.

7. The improved optical system of claim 1 incorporated in an illuminator.

8. An improved optical system comprising:
a high aspect ratio linear junction laser diode having an emitting junction producing widely divergent radiation;
a cylindrical lens having a circular cross-section with a diameter on the order of the laser diode emitting junction length and being spaced a fraction of the diameter of the cross-section from the emitting junction of the laser diode, the longitudinal axis of the cylindrical lens being parallel to the emitting junction, whereby the widely divergent radiation emitted from the laser diode in a plane perpendicular to the longitudinal axis of the laser diode passes through the cylindrical lens and is converted to a narrowly diverging radiation and projected to a collimating lens to illuminate an object.

9. The improved optical system of claim 8, and further comprising:
a V-shaped surface formed in the laser diode, the emitting junction being disposed at the bottom of the V-shaped surface, and the cylindrical lens being disposed within the V-shaped surface for facilitating alignment of the cylindrical lens with the emitting junction.

10. The improved optical system of claim 8, in which the laser diode includes a case having a window through which light from the emitting junction is projected, and wherein the cylindrical lens is positioned under the window and totally encapsulated within the case.

11. The improved optical system of claim 8, wherein the cylindrical lens comprises a fiber optic strand.

12. The improved optical system of claim 11, wherein the fiber optic strand comprises optical glass.

13. The improved optical system of claim 12, wherein the laser diode includes a plurality of emitting junction, and wherein the improvement comprises the same plurality of cylindrical lenses positioned adjacent to respective emitting junction of the laser diode and parallel with one another, the longitudinal axes of the cylindrical lenses being parallel to the longitudinal axis of the emitting regions.

14. The improved optical system of claim 8 incorporated in a rangefinder.

15. The improved optical system of claim 8 incorporated in a laser spot projector.

16. A method for improving the degree of collimation of light emitted from a linear junction laser diode having an elongated emitting junction and a window capped case, which comprises:
removing the window capped case from the laser diode;
positioning a cylindrical lens having a circular cross-section with a diameter on the order of the laser diode emitting junction length a fraction of the diameter of the cross-section from the emitting junction of the laser diode such that the longitudinal axis of the cylindrical lens is parallel to the emitting region, whereby widely divergent light emitted from the emitting region in a plane perpendicular to the longitudinal axis of the laser diode is converted to a narrowly divergent radiation by the cylindrical lens; and
replacing the window capped case on the laser diode, whereby the window capped case totally encapsulates the cylindrical lens.

17. A method for manufacturing an improved laser diode which emits light having enhanced collimation, which comprises:
manufacturing a linear junction laser diode having a semiconductor chip with a V-shaped surface formed therein and an emitting region disposed at the bottom of the V-shaped surface; and
positioning a cylindrical lens having a circular cross-section with a diameter on the order of the laser diode junction length and spaced a fraction of the of the cross-section diameter from the emitting region such that the longitudinal axis of the cylindrical lens is parallel to the emitting region, the cylindrical lens being disposed within the V-shaped surface of the semiconductor chip for facilitating alignment of the cylindrical lens with the emitting region.

18. The laser diode manufacturing method of claim 17 further including the step of:
attaching a window capped case to the laser diode, whereby the window capped case totally encapsulates the emitting junction and the cylindrical lens.

19. An improved optical system in which radiation emitted from an electrically conductive wire filament having an elongated emitting junction is projected to a collimating lens to irradiate an object, the improvement comprising:
a cylindrical lens having a circular cross-section with a diameter on the order of the length of the wire filament and being spaced a fraction of the diameter of the cross-section from the wire filament, the longitudinal axis of the cylindrical lens being parallel to the longitudinal axis of the wire filament, whereby widely divergent radiation emitted from the wire filament in a plane perpendicular to the longitudinal axis of the wire filament passes through the cylindrical lens and is converted to a narrowly diverging radiation and projected to the collimating lens.

* * * * *

UNITED STATES PATENT AND TRADEMARK OFFICE
CERTIFICATE OF CORRECTION

PATENT NO. : 5,426,533
DATED : Jun. 20, 1995
INVENTOR(S) : Wallace

It is certified that error appears in the above-identified patent and that said Letters Patent is hereby corrected as shown below:

Column 8, line 26, after "of the", insert -- diameter --;

Column 8, line 27, after "cross-section ", delete "diameter".

Signed and Sealed this

Twenty-first Day of November, 1995

BRUCE LEHMAN

Attest:

Attesting Officer

Commissioner of Patents and Trademarks